United States Patent [19]

Jason et al.

[11] 4,339,729
[45] Jul. 13, 1982

[54] ANALOG INTEGRATED FILTER CIRCUIT

[75] Inventors: Barry L. Jason, Bedford; Scott M. Hall, Fort Worth; Richard L. Valley, Bedford, all of Tex.

[73] Assignee: Motorola, Inc., Schaumburg, Ill.

[21] Appl. No.: 134,382

[22] Filed: Mar. 27, 1980

[51] Int. Cl.³ .............................................. H03F 1/34
[52] U.S. Cl. .................................. 330/294; 330/288; 330/289; 330/305; 330/306
[58] Field of Search ............... 330/107, 288, 289, 294, 330/302, 303, 305, 306, 307; 328/127, 128; 307/295

[56] References Cited

U.S. PATENT DOCUMENTS 3,911,296 10/1975 Davis .................................. 307/297
3,969,682 7/1976 Rossum ........................... 330/260 X
4,205,276 5/1980 Wright et al. ................... 330/302 X Primary Examiner—James B. Mullins
Attorney, Agent, or Firm—James A. Scheer; James W. Gillman

[57] ABSTRACT

An analog integrated filter circuit includes a capacitance multiplier combined with a DC bias controlled current circuit designed to render the filter circuit insensitive to changes in the parameter values of the components caused by process variations or a temperature change therein. The capacitance multiplier circuit includes grounded or ungrounded capacitance multipliers in different combinations operatively coupled to the DC bias controlled current circuit so that the capacitance multiplier circuit can be used to construct a predictable low pass, bandpass or high pass filter circuit with frequency characteristics that do not vary over temperature.

10 Claims, 17 Drawing Figures

LOW PASS FILTER

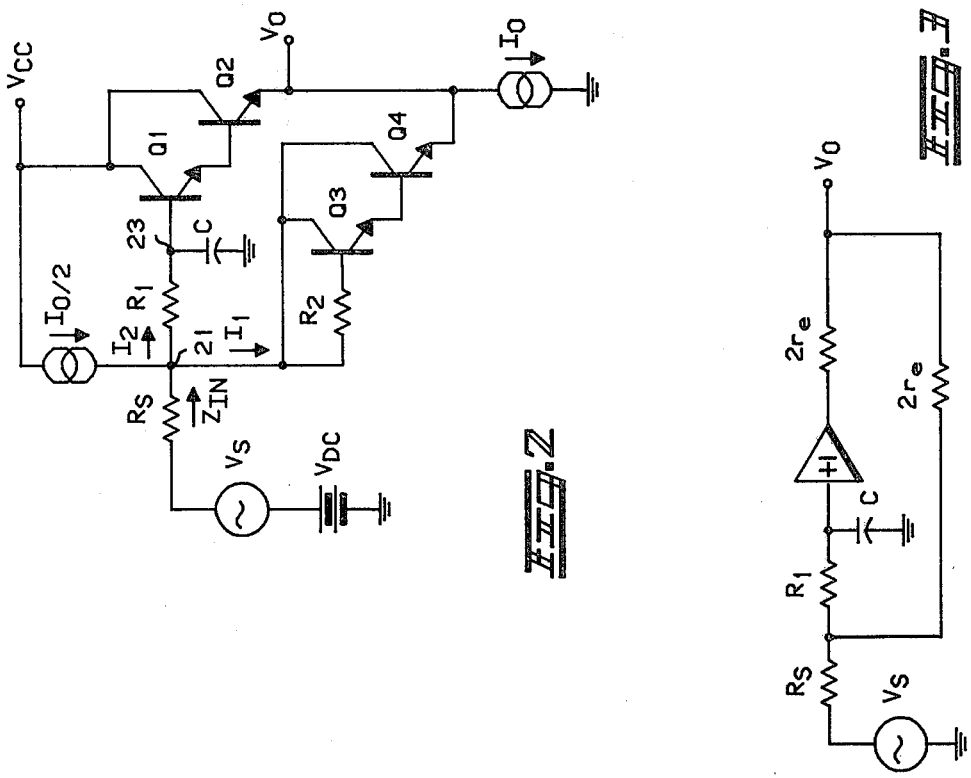
FIG.2
FIG.3
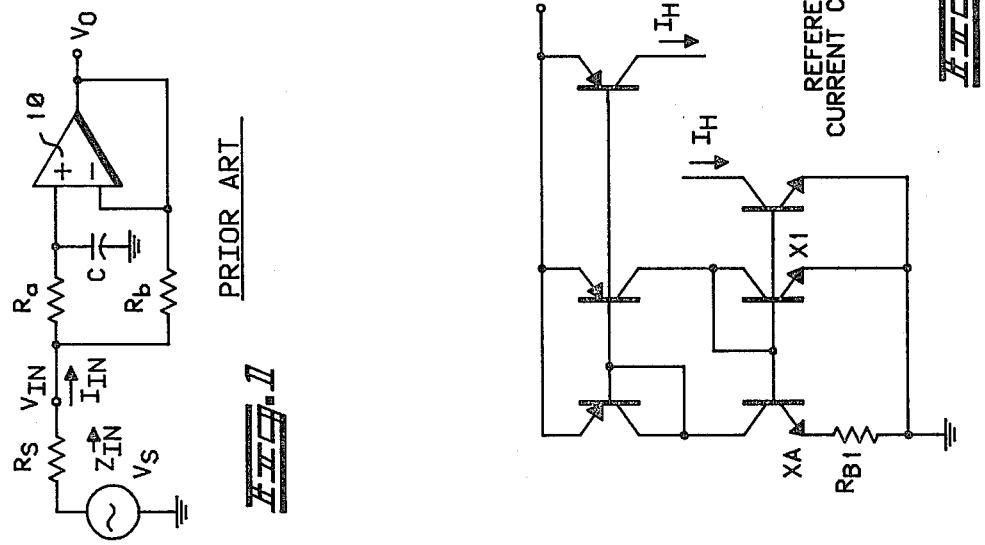
FIG.1 PRIOR ART
FIG.4 REFERENCE CURRENT CIRCUIT

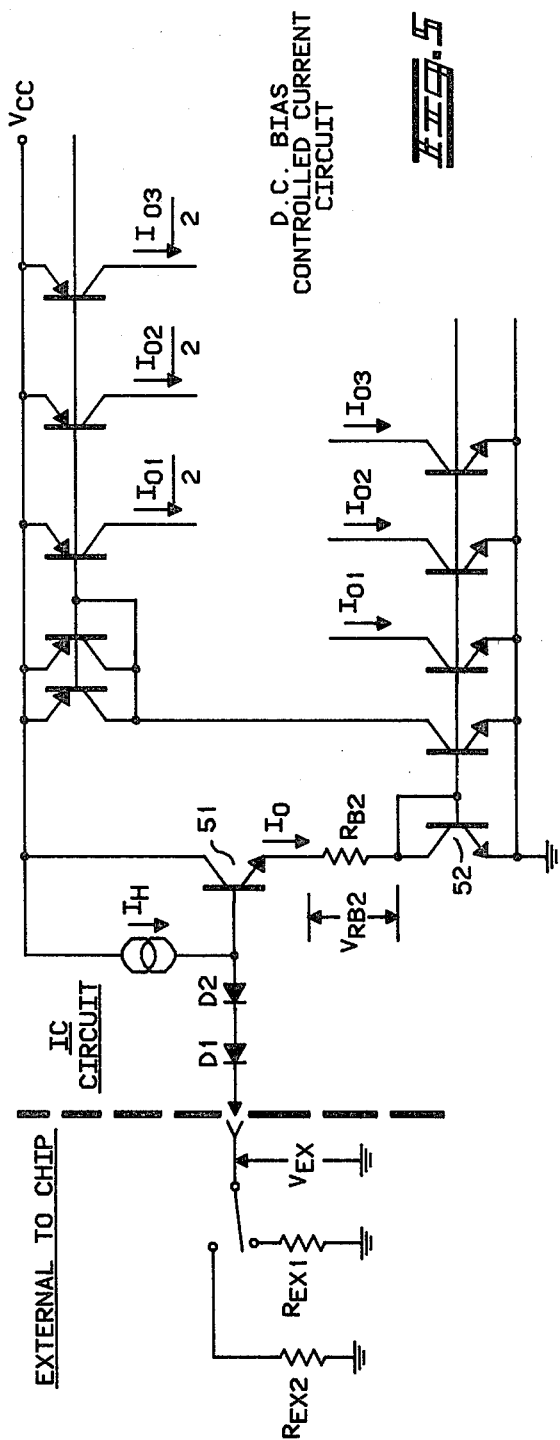
FIG. 5
D.C. BIAS CONTROLLED CURRENT CIRCUIT
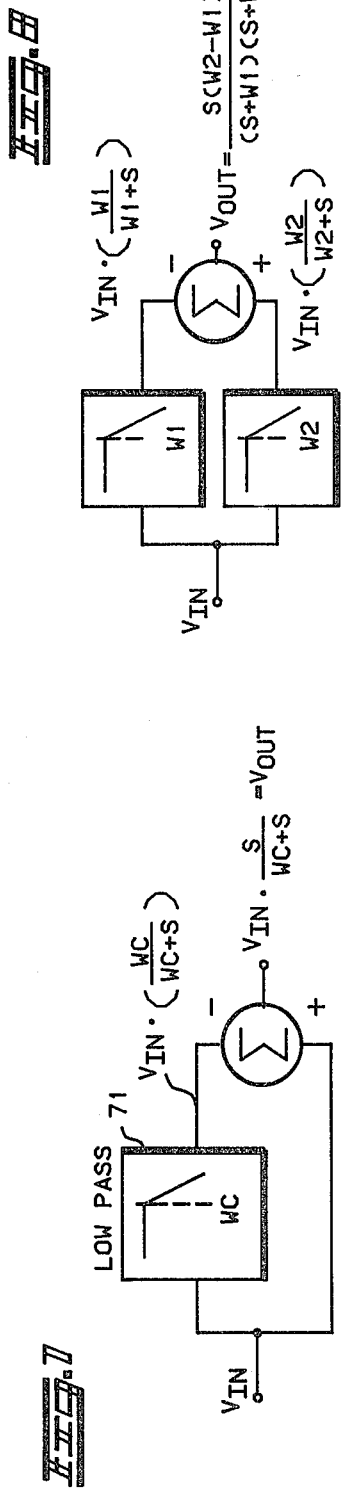
FIG. 6
$$V_{OUT} = \frac{S(W_2 - W_1)}{(S + W_1)(S + W_2)}$$
FIG. 7

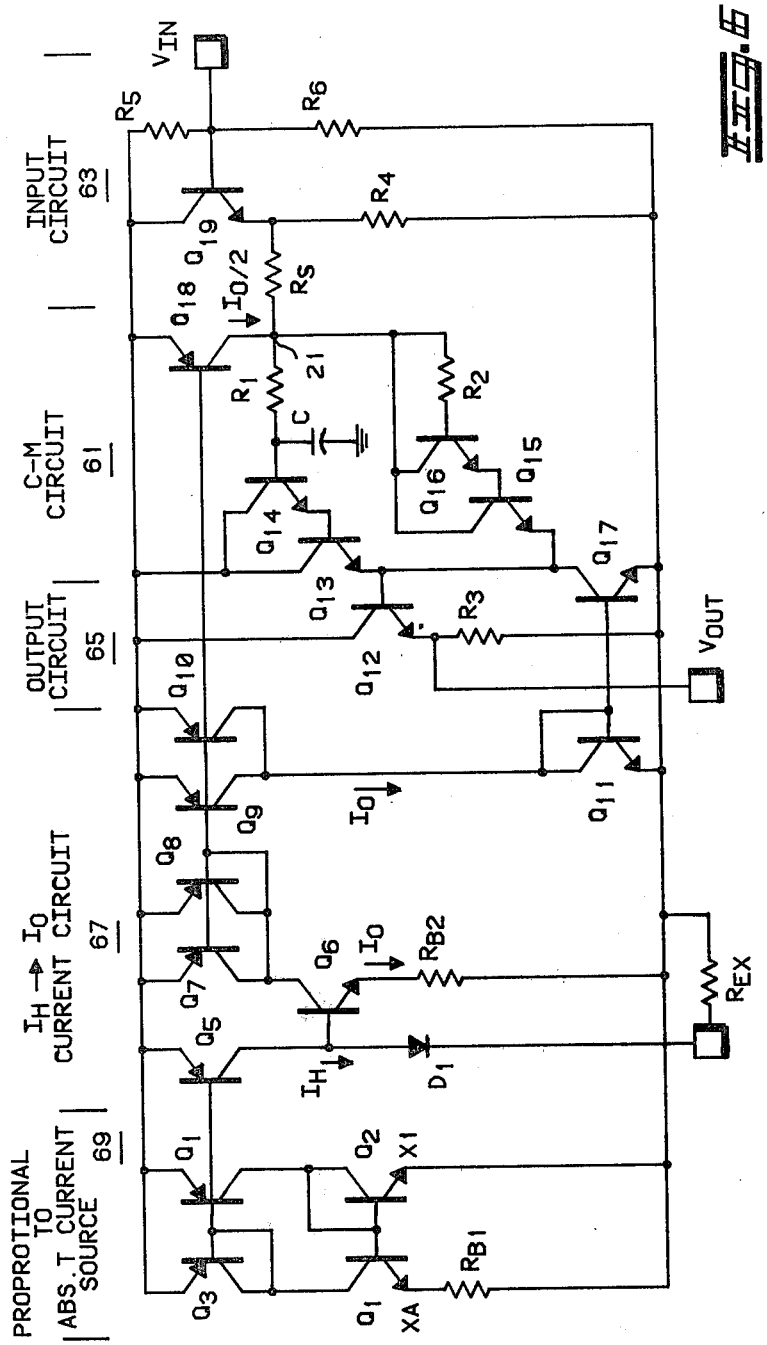

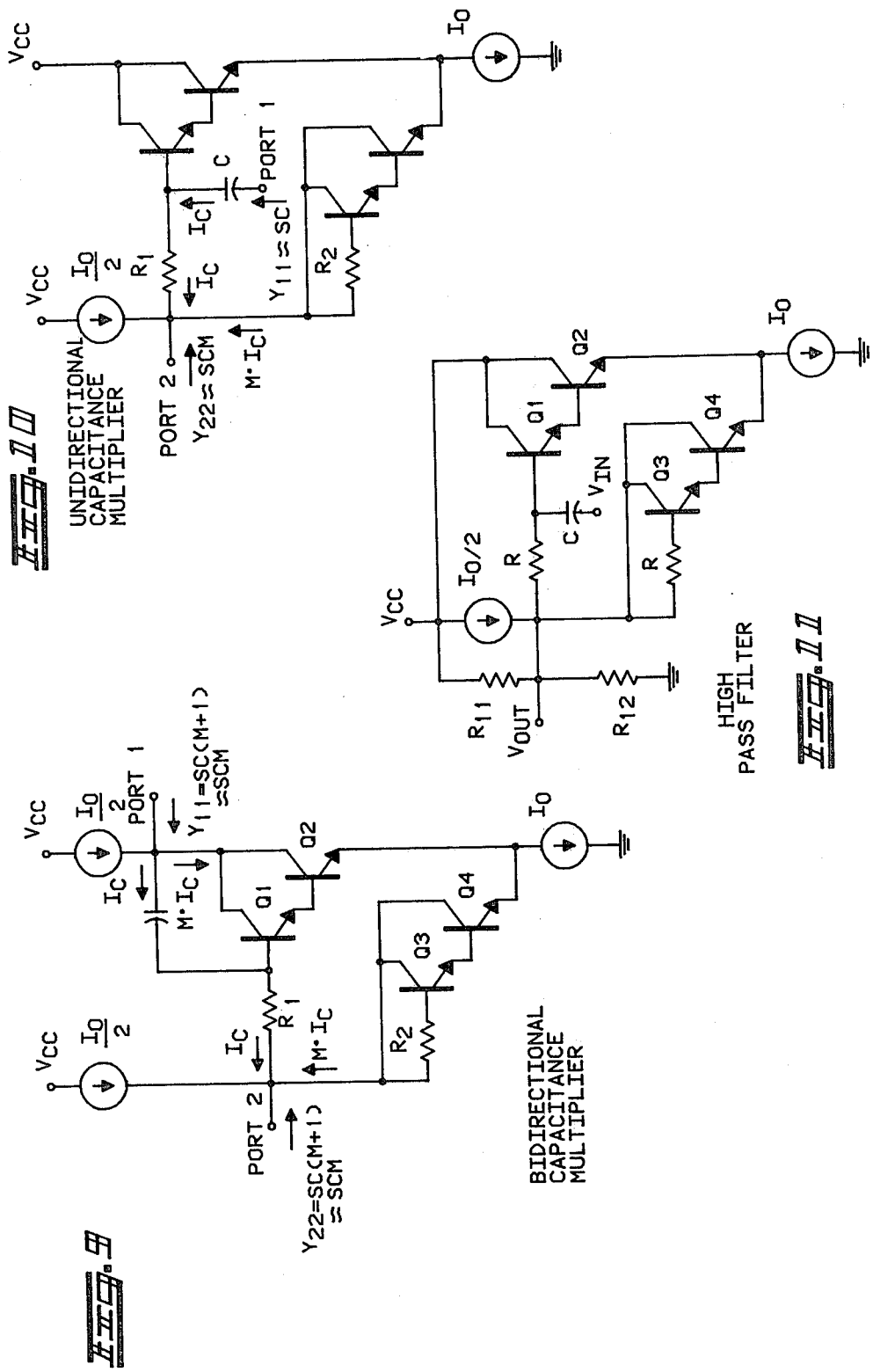

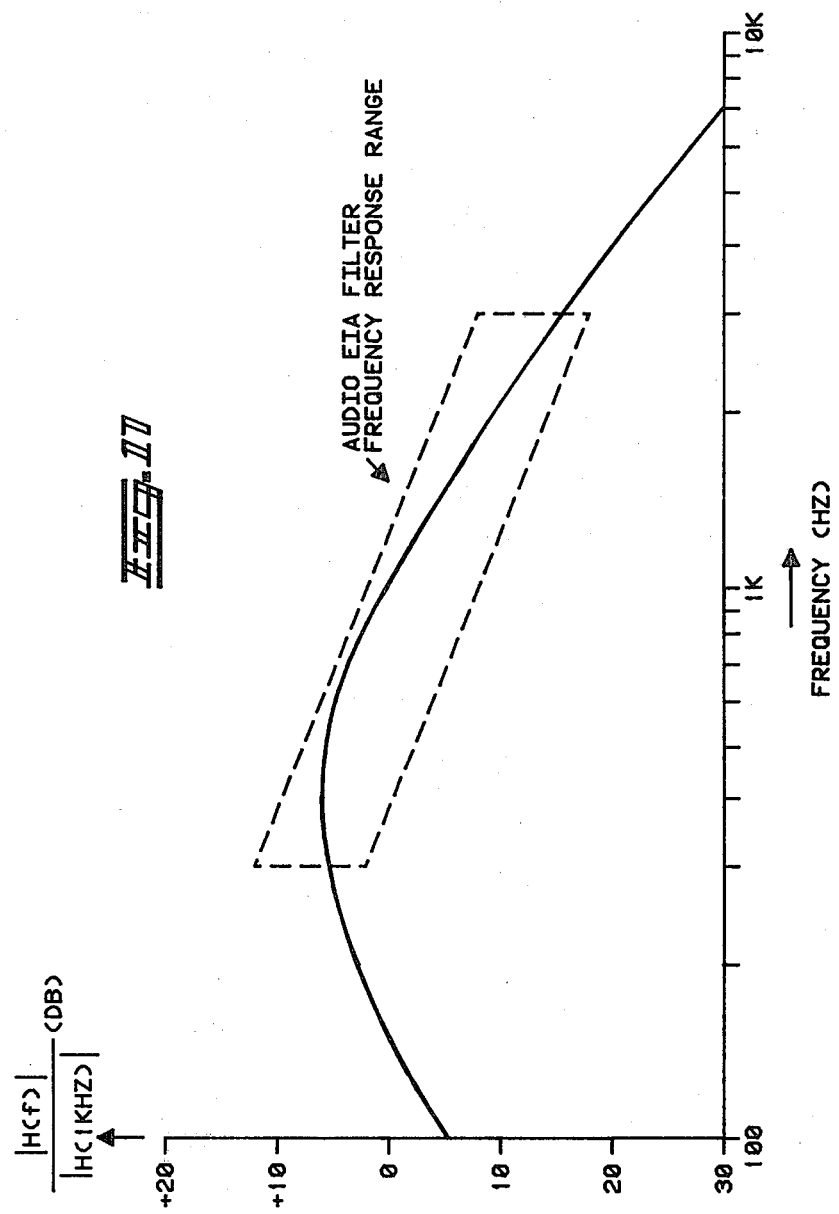

SECOND ORDER
LOW PASS FILTER

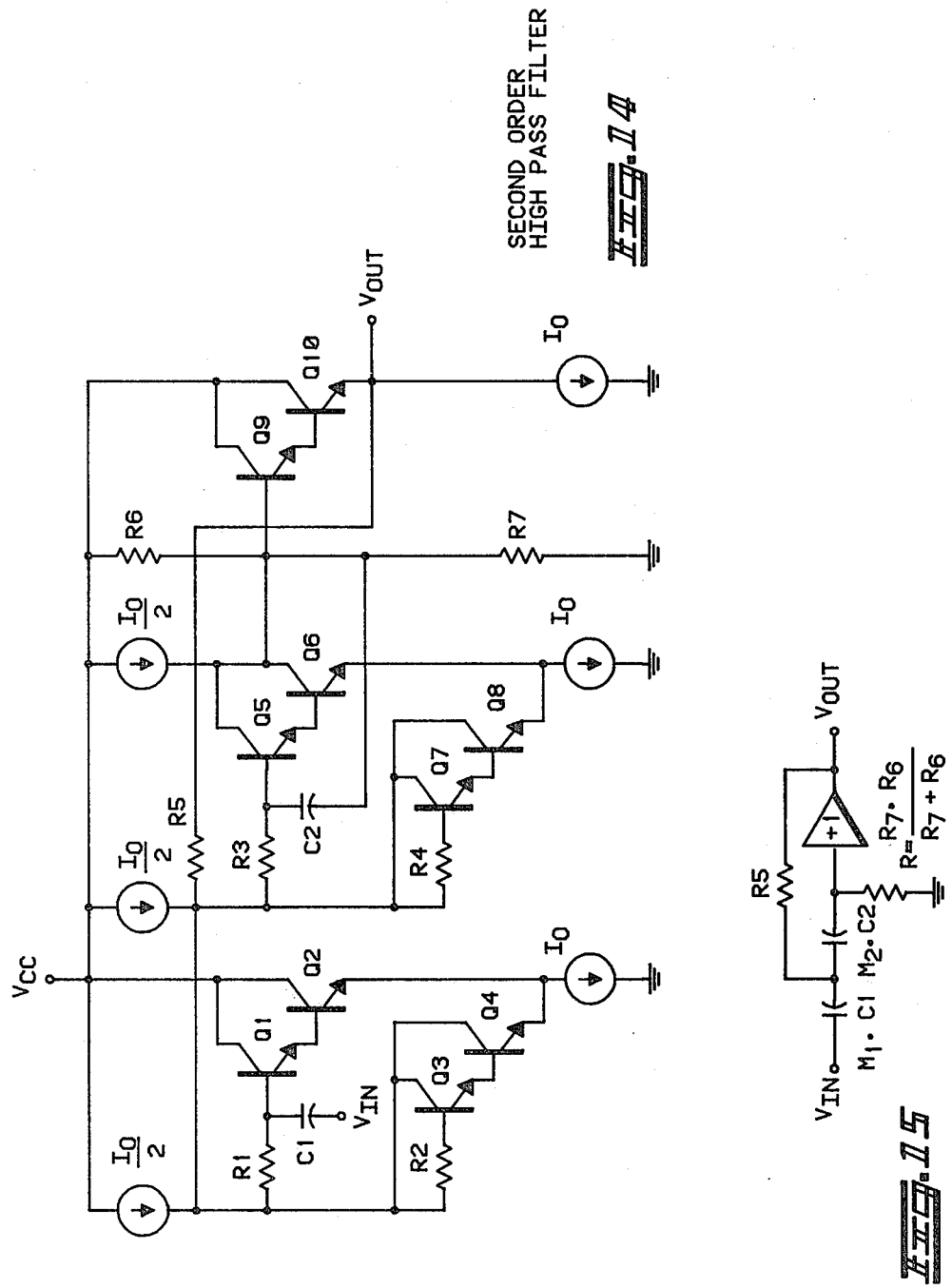

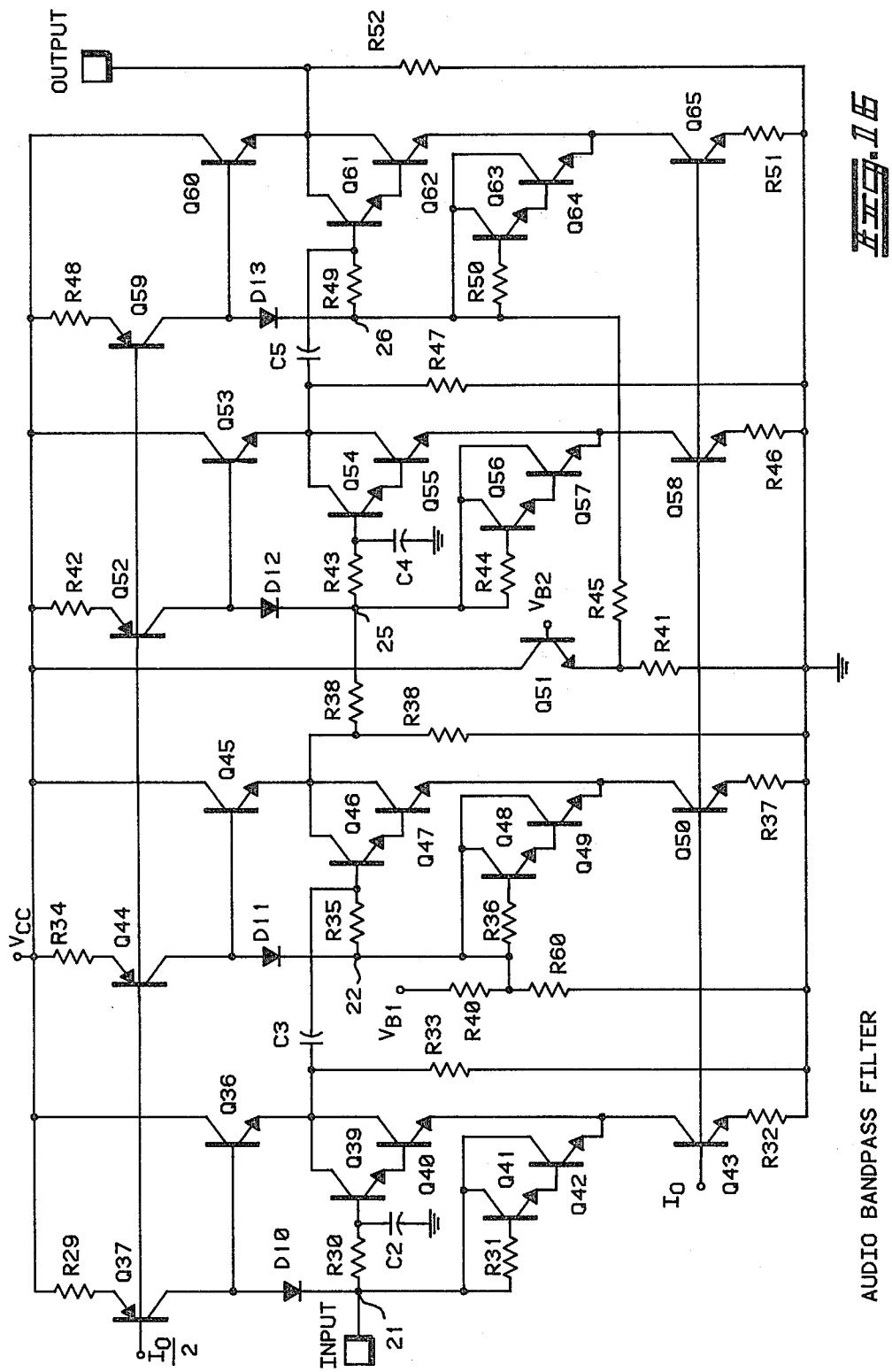

ANALOG INTEGRATED FILTER CIRCUIT

FIELD OF THE INVENTION

This invention relates to an integrated filter circuit and, more particularly, an improved analog integrated filter circuit.

BACKGROUND OF THE INVENTION

In the simplest form filters are formed with combinations of resistors and capacitors, with the frequency characteristic of the filter being dependent upon the values of the resistors and capacitors. Integrated circuit component values are subject to variations as a result of processing tolerances and operating temperature. For example, integrated resistors can typically vary plus or minus 30% due to processing and an additional plus or minus 50% due to temperature variations.

Accordingly, the cutoff (or corner) frequency, $f_c$, of the conventional integrated filter circuit tends to drift as the operating temperature of the semiconductor circuit changes.

Still another shortcoming of a conventional semiconductor integrated filter circuit is that its frequency corner is limited to frequencies above the audio range due to a limit on the amount of capacitance that can be obtained on an integrated circuit.

OBJECTS AND SUMMARY OF THE INVENTION

It is a general object of the present invention to provide an improved analog integrated filter circuit.

It is a more specific object of the present invention to provide an analog integrated filter circuit whose frequency characteristics are constant over a range of the operating temperature of the integrated circuit.

It is also a specific object of the invention to provide an analog integrated filter circuit whose frequency characteristics are independent of the absolute value of the integrated resistors.

In accordance with the above and other objects, the analog integrated circuit of the present invention includes a capacitance multiplier combined with a DC bias circuit especially adopted to enable the filter to have constant frequency characteristics in spite of absolute value changes in the resistances and temperature changes of the integrated circuit.

It is another feature of the present invention that the capacitance multiplier filter includes one or more grounded capacitance multipliers and ungrounded capacitance multiplier circuits connected in different combinations and operatively coupled to the bias circuit for providing predictable and temperature insensitive low pass, bandpass or high pass filter functions.

In accordance with another feature of the present invention, the capacitance multiplier circuit used in the filter is arranged to operate either as a unidirectional or bidirectional capacitance multiplier or a grounded capacitance multiplier.

It is yet another feature of the present invention that the filter is programmable in that the external resistor which is coupled to the DC bias controlled current circuit can be varied and thereby vary the cutoff frequency of the filter.

The foregoing and other objects and features of the present invention will be clearer from the following description of illustrative embodiments with reference to the accompanying drawings.

BRIEF DESCRIPTION OF THE DRAWINGS

FIG. 1 shows a capacitance multiplier circuit and filter network of a conventional prior art design.

FIG. 2 shows an integrated low pass filter circuit with a grounded capacitance multiplier according to the present invention.

FIG. 3 shows a functional equivalent circuit of the integrated low pass filter shown in FIG. 2.

FIG. 4 shows a reference current supply circuit of a conventional design which is used in generating a DC bias controlled current circuit.

FIG. 5 shows an illustrative embodiment of a DC bias controlled current circuit designed to provide a DC bias controlled current in the integrated filter circuit in accordance with the present invention.

FIG. 6 shows a circuit including a grounded capacitance multiplier and an embodiment of the DC bias controlled current circuit operatively coupled with the capacitance multiplier to provide a low pass filter.

FIG. 7 shows a functional schematic drawing of a high pass filter using a low pass filter of the type shown in FIG. 6.

FIG. 8 shows a functional schematic drawing of a bandpass filter utilizing two low pass filters of the type shown in FIG. 6.

FIG. 9 shows a capacitance multiplier connected to operate as a bidirectional capacitance multiplier.

FIG. 10 shows a capacitance multiplier circuit connected to operate as a unidirectional capacitance multiplier.

FIG. 11 shows a high pass filter using the unidirectional capacitance multiplier shown in FIG. 10.

FIG. 14 shows a second-order, high pass filter using a unidirectional capacitance multiplier and a bidirectional capacitance multiplier.

FIG. 15 shows a functional equivalent schematic drawing of the circuit shown in FIG. 14.

FIG. 16 shows an audio bandpass filter utilizing a pair of grounded capacitance multipliers and a pair of unidirectional capacitance multipliers.

FIG. 17 shows the frequency response characteristic of the audio bandpass filter shown in FIG. 16.

DETAILED DESCRIPTION OF THE PREFERRED EMBODIMENTS

Figure 13:
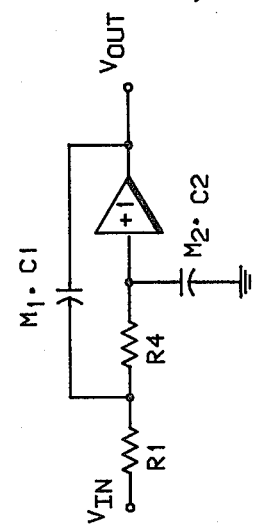
FIG. 13 shows an equivalent functional schematic drawing of the circuit shown in FIG. 12.

Referring to FIG. 1, there is shown a conventional low pass filter using a bootstrap capacitance multiplier comprised of a capacitor, an operational amplifier (Op Amp), and associated resistors. Such a filter is shown in detail in U.S. Pat. No. 3,831,117 to Arthur J. Kline and issued on Aug. 20, 1974. Briefly stated, such a filter includes an operational amplifier 10, resistors $R_a$, $R_b$ and $R_s$, and a capacitor, C, operatively connected as illustrated. As shown, the circuit operates as a RC low pass filter. An external input signal may be applied to the filter through the resistor $R_s$. The input, $V_{IN}$, to the low pass filter is subjected to low pass filtering and taken at the output terminal in the form of output voltage $V_o$. The operational amplifier 10 and the resistors $R_a$ and $R_b$ coupled in this manner provide capacitance multiplication to the grounded capacitor C. The capacitance multiplier provides a multiplying factor, $M_f$, to the capacitance of the capacitor, C, whereby the effective capacitance $C_{eff}$ of the circuit is made to be equal to the multiplication factor, $M_f$, times the capacitance C. The multiplication factor, $M_f$, of the circuit is substantially equal to $(R_a)/(R_b)$ and is derived as follows:

$$I_{IN} = V_{IN} \cdot \left[ \frac{sC}{1 + sC \cdot R_a} + \frac{sC \cdot \frac{R_a}{R_b}}{1 + sC R_a} \right] \quad (1)$$

$$s = jw$$

$$Z_{IN} = \frac{V_{IN}}{I_{IN}} = \frac{1 + sC \cdot R_a}{sC \left(1 + \frac{R_a}{R_b}\right)} \approx \quad (2)$$

$$\frac{1}{sC \left(1 + \frac{R_a}{R_b}\right)} \text{ for } w << \frac{1}{R_a \cdot C}$$

$$\therefore M_f = \frac{C_{eff}}{C} = 1 + \frac{R_a}{R_b} \approx \frac{R_a}{R_b} \quad (3)$$

for $R_a >> R_b$

The corner frequency, $f_c$, of the low pass filter is $$f_c = \frac{1}{2\pi C \cdot M_f \cdot R_s} \quad (4)$$

It is clear from equation (3) that the effective capacitance multiplication factor $M_f$ is $(R_a)/(R_b)$.

The conventional op-amp multiplier is satisfactory for use in a filter in discrete form in that its frequency response characteristics are predictable and thermally insensitive. The cutoff frequency, $f_c$, is predictable because the discrete elements $R_a$, $R_b$, $R_s$ and C are available in any value and with any tolerance desired. In addition, the cutoff frequency, $f_c$, can be made unaffected by thermal drift because resistors $R_a$, $R_b$ and $R_s$, and capacitor C are available which are not thermally sensitive in actual operation. Stated in other words, the elements $R_a$, $R_b$, $R_s$ and C are of the type that do not vary from their desired values in any significant manner. As a result, the filter using a capacitance multiplier with an operational amplifier and discrete elements is predictable and thermally insensitive over a range of operating temperature of the filter.

It has been found that a conventional discrete filter in the form of an integrated circuit is neither predictable nor insensitive to temperature because, as is evident from the equation (4), the corner frequency, $f_c$, is inversely dependent on resistor $R_s$ and the resistance of the resistor $R_s$ in integrated circuit form changes widely, as much as two to one, when subjected to the change of the temperature in the integrated circuit during its usual operation. Also it has been found that the absolute value of resistor $R_s$ can vary as much as $\pm 30\%$ as a result of the normal integrated circuit manufacturing process. In equation (4) the capacitor C when realized in integrated form and the multiplication factor $M_f$ realized as the ratio of two integrated resistors, are not subject to significant processing or temperature variations.

A capacitance multiplier circuit in integrated circuit form is already known as found in the U.S. Pat. No. 3,911,296 to William F. Davis, granted on Oct. 7, 1975. Further attempts have been made in the past to develop a capacitor for use in an integrated capacitance multiplier, as illustrated in the U.S. Pat. No. 3,953,875 to David L. Cave, granted on Apr. 27, 1976, or to develop a capacitance multiplier circuit to be used to prevent oscillation in an amplifier circuit, as illustrated in the U.S. Pat. No. 4,027,271 to David L. Cave and granted on May 31, 1977.

In particular, the aforementioned U.S. Pat. No. 4,027,271 shows use of a capacitance multiplier circuit in an integrated form with a circuit to swamp out the undesired impedance reflected from the load to the input of the Darlington circuit used in the integrated circuit. What this does is to prevent the amplifier from oscillating due to reflected impedances.

The Applicants found that none of the prior art, that they know of, including the aforementioned patents, however, suggest or show how the capacitance multiplier may be utilized in an integrated circuit to form a filter which is predictable and temperature insensitive over a range of temperature in which it is generally required to operate.

In accordance with the present invention, Applicants have found an inventive way of using capacitance multipliers in combination with an inventive DC bias controlled current circuit to form an integrated analog filter circuit which is predictable and temperature insensitive over a wide range of temperature in which the filter operates.

Now referring to FIG. 2, there is shown in a schematic form an analog integrated circuit with a grounded capacitance multiplier and DC bias controlled current source $I_o$ operatively coupled to provide an analog integrated low pass filter.

As shown in FIG. 2, the first Darlington pair $Q_1$ and $Q_2$ is interposed between a bias voltage source $V_{cc}$ and a DC bias controlled current source that supplies a controlled current, $I_o$, of a given amplitude. The capacitor, C, is coupled to the base electrode of the first transistor of the first Darlington pair and ground, and the resistance $R_1$ is coupled between the base electrode of the transistor $Q_1$ and a source resistance $R_s$. A second controlled current source of a predetermined amplitude relative to the DC bias controlled current, for example one-half ($\frac{1}{2}$) the amplitude of the DC bias controlled current $I_o$, from the current source is connected between the bias source $V_{cc}$ and the resistor $R_1$. While one-half ($\frac{1}{2}$) amplitude is found suitable, of course, the amplitude of the second current need not be so limited. It can be some other proportion of the first DC bias current. The second Darlington pair $Q_3$ and $Q_4$ is connected between the second and first bias current source and a resistor $R_2$ is connected between the second bias current source and the base electrode of $Q_3$ of the second Darlington pair. In the manner the circuit is connected, the $R_b$ of the capacitance multiplier circuit shown in FIG. 1 is effectively replaced in the integrated capacitance multiplier circuit of FIG. 2 by the small signal impedance $4r_e$ where $r_e$ is the small signal emitter-to-base junction impedance of each of $Q_2$ and $Q_4$. Thus the filter characteristics depend on the value of $r_e$. It is also noted that $r_e$ is inversely proportional to the DC bias currents through each of $Q_2$ and $Q_4$. Since the DC bias current through each of $Q_2$ and $Q_4$ is one-half of the current $I_o$, it is clear that the filter characteristics of the circuit depends upon the DC bias controlled current $I_o$.

The capacitance multiplication factor, $M_f$, of the capacitive multiplier shown in FIG. 2 is a function of the term $(R_1 I_o)/(8nV_T)$. This relationship was obtained as follows:

Referring to the circuit shown in FIG. 2, $$Z_{in} = \frac{V_{in}}{(I_1 + I_2)} = \frac{1 + sC \cdot R_1}{sC\left(1 + \frac{R_1}{4r_e}\right)} \quad r_e = \frac{2nV_T}{I_o} \ ; \ s = jw \quad (5)$$

$$\therefore M_f = \left(1 + \frac{R_1}{4r_e}\right)\frac{R_1}{4r_e} = \frac{R_1}{4\frac{2nV_T}{I_o}} = \frac{R_1 I_o}{8nV_T} \quad (6)$$

for $R >> 4r_e$, and $w << \frac{1}{R_1 C}$, where $nV_T$ is $(nKT)/(q)$, and K is Boltzman Constant, T is absolute temperature, q is the electrical charge, and n is the diode slope factor.

$$\frac{V_o}{V_s}(s) = \frac{1}{1 + sCM_f R_s} \quad (7)$$

then, the 3 db corner frequency, $$f_c = \frac{1}{2\pi C \cdot M_f \cdot R_s} = \frac{8nV_T}{2\pi R_s \cdot C \cdot R_1 \cdot I_o} \quad (8)$$

As noted in the equation (6) above, the multiplication factor is dependent upon the bias current, $I_o$, for the filter in FIG. 2. From the equation (8), it is also clear that the corner frequency of the low pass filter is also a function of $I_o$ as well as $R_s$, $R_1$, $V_T$, and capacitance C.

In accordance with an aspect of the present invention, an inventive DC bias controlled current circuit is provided to supply a control current which controls or renders the filter's frequency characteristic relatively insensitive to both thermal drift and changes in the absolute value of the resistances. In providing the DC bias controlled current, first, a reference current $I_H$ circuit is provided as illustrated in FIG. 4 which is proportional to $V_T$. The reference current, $I_H$, supplied by the circuit shown in FIG. 4 provides $$I_H = \frac{nV_T \cdot \log_e A}{R_{B1}} \quad (9)$$

where A is an emitter-scaling ratio and $R_{B1}$ is an integrated resistor in the circuit as shown.

The reference current circuit illustrated in FIG. 4 forms a part of the biasing circuitry for providing the DC bias controlled current for the filter.

FIG. 5 shows an overall DC bias control current circuit according to the present invention which provides the controlled current $I_o$. As illustrated in FIG. 5, the reference current $I_H$ is brought out of the integrated circuit and applied to an external resistance $R_{EX1}$ (or $R_{EX2}$) via diodes $D_1$ and $D_2$. The diodes $D_1$ and $D_2$ are selected so that the voltage drop thereacross cancels out the voltage drops across the base-to-emitter of the transistor 51, and base-to-emitter of transistor 52. In this manner, in effect a voltage $V_{EX}$ is internally applied across another integrated resistor $R_{B2}$. The resulting bias control current $I_o$ flowing through the resistor $R_{B2}$ forms a potential drop, $V_{RB2}$, which is about equal to $V_{EX}$ across the external resistor $R_{EX}$. As noted in FIG. 5, various levels of bias currents, $I_{o1}$, $I_{o2}$, $I_{o3}$, for different filter sections, can be obtained in the manner shown as required.

Mathematically, the DC bias controlled current circuit shown in FIG. 5 may be analyzed as follows:

$$V_{EX} = I_H R_{EX} \quad V_{EX} = V_{RB2} = I_o R_{B2} \quad (10)$$

From this and equation (9) above, $$I_o = \frac{V_{EX}}{R_{B2}} = I_H \frac{R_{EX}}{R_{B2}} = \frac{nV_T \cdot \log_e A \cdot R_{EX}}{R_{B1} \cdot R_{B2}} \quad (11)$$

Substitution $I_o$ of equation (11) into equation (8) results in frequency, $f_c$, as follows:

$$f_c = \frac{8 R_{B1} \cdot R_{B2}}{2\pi \log_e A \cdot C \cdot R_s \cdot R_1 \cdot R_{EX}} \quad (12)$$

External resistor $R_{EX}$ is selected of the type which has very low temperature coefficient and thus low thermal drift.

From the equation (12), it is noted that when passive resistance elements $R_{B1}$, $R_{B2}$, $R_s$ and $R_1$ are made using a conventional fabrication process for integrated circuits, then the temperature dependency of the corner frequency $f_c$ will be approximately reduced to the temperature characteristics of $1/R_{EX}C$ term. This is so because even though the resistance of individual resistors $R_{B1}$, $R_{B2}$, $R_1$ and $R_s$ vary as temperature thereof changes, the ratio, $(R_{B1} \cdot R_{B2})/(R_s \cdot R_1)$, remains constant. The external resistor, $R_{EX}$, can be picked which has low temperature coefficient and thus low thermal drift. Thermal drift in the corner frequency is reduced to that of capacitor, C, of the integrated circuit chip. An integrated capacitor can be realized which exhibits negligible thermal drift.

FIG. 6 shows how the capacitive multiplier shown in FIG. 2 with grounded capacitor and an embodiment of the bias controlled current circuit shown in FIG. 5 are operatively combined to form a low pass integrated filter free of thermal drift. From equation (11), it is shown that the absolute value of the corner frequency, $f_c$, is inversely dependent on the value of the external resistor, $R_{EX}$. So, by changing the value of the external resistor $R_{EX}$ from one value $R_{EX1}$ to another, $R_{EX2}$, the corner frequency of the filter or filter sections can be changed. Thus, the corner frequency can be externally programmed. The capacitance multiplier filter circuit shown in FIG. 6 and described hereinabove is essentially limited to providing a low pass filtering circuit because of the grounding of its capacitor.

More specifically, referring back to FIG. 6, there is shown an illustrative schematic circuit of a low pass filter in an integrated circuit form. It shows how an embodiment of the DC bias controlled current source shown in FIG. 5 is combined with the grounded capacitance multiplier shown in FIG. 2 to form a low pass filter. The low pass filter includes a grounded capacitance multiplier section 61 interposed between an input circuit 63 and an output circuit 65. The DC bias controlled current circuit 67 includes the reference current, $I_H$, generated by stage 69, which is applied via diode $D_1$ to the external resistor $R_{EX}$. The reference current $I_H$ is used to generate the DC bias controlled current, $I_o$, by the bias controlled current circuit 67. The bias controlled current is applied to the current sink comprised of transistors $Q_{11}$ and $Q_{17}$ which are coupled between the current source, $I_o$, and the emitter electrodes of the two Darlington transistors $Q_{13}$ and $Q_{15}$.

The DC bias controlled current circuit provides another bias control current source with amplitude thereof being a predetermined proportion such as one-half ($I_o/2$) of the bias controlled current at the input of the capacitance multiplier through a transistor network $Q_7$, $Q_8$ and $Q_{18}$.

In operation, the input applied at the input terminal, $V_{IN}$, is applied through the input transistor $Q_{19}$ and input resistor $R_s$ to the common junction 21 and thence to the capacitance multiplier 61. The multiplier effectively multiplies the capacitance C. With the grounded capacitance, the output of the multiplier is coupled to the output circuit 65. The grounded capacitance enables the multiplier to act as a low pass filter and provide capacitance multiplication whereby the area used in the integrated circuit for capacitance is effectively reduced to 100th to 1000th of the area that would otherwise be needed without the multiplier. The output of the multiplier is outputted through a transistor $Q_{13}$ to the output terminal $V_{OUT}$.

As explained above in equation (12), the absolute value of the corner frequency, $f_c$, is inversely dependent upon the value of the external resistor, $R_{EX}$. So, by changing the value of the external resistor, $R_{EX}$, the corner frequency of the filter or filter sections can be changed. Thus, the corner frequency can be externally programmed. The grounded capacitance multiplier shown in FIGS. 2 and 6 and described hereinabove is used to provide a low pass filter circuit.

FIG. 7 illustrates an example of how the low pass filter shown in FIGS. 2 and 6 can be used with a conventional subtracting circuit to provide a high pass filter. The output of the low pass filter is $$\frac{WC}{WC + s} \cdot V_{IN}.$$

When this is combined with the input $V_{IN}$ in the subtracting circuit, the output $V_{OUT}$ is $$V_{IN} \cdot \frac{s}{WC + s}.$$

FIG. 8 illustrates an example of how a pair of the low pass filter shown in FIG. 2 or 6 can be used in parallel with two different corner frequencies, $W_1$ and $W_2$, to form a bandpass filter. As shown in FIG. 8, the outputs of the two low pass filters are combined by a subtracting circuit to provide an output $$V_{OUT} = V_{IN} \cdot \frac{s(W2 - W1)}{(s + W1)(s + W2)}$$

In accordance with another feature of the present invention, the capacitance multiplier is used in different ways than grounded capacitance connection. This is accomplished by ungrounding the grounded terminal of the capacitor and connecting it to elsewhere to effect bidirectional or unidirectional multiplication as will be more fully described later. Since the multiplier is not limited to the grounded capacitor, the multiplier offers an integrated circuit replacement for any capacitor in many discrete filter designs including those in which the capacitor is not grounded. This allows a direct translation between the discrete filter design and integrated filter design, and hence the variations to the grounded capacitance multiplying technique shown in FIG. 2 is expanded to provide very versatile multiplying techniques that offer practical design even for integrated filtering circuits for the audio frequency band requiring high levels of effective capacitance.

FIG. 9 illustrates a variation to the grounded capacitance multiplier. It is designed to provide a bidirectional multiplier which provides the same impedance from either direction. As shown, the terminal of the capacitor, C, which was grounded is now ungrounded and coupled to the collector electrodes of the first Darlington pair and applying a bias current such as $I_o/2$ to the collector junctions of the first Darlington pair. The bidirectional capacitance multiplier simulates a capacitor of value $(M+1)C$ between port 1 to port 2 by multiplying $I_C$ by multiplying factor, $M_f$, and adding the resulting current $M_f I_C$ to $I_C$ at port 2 and subtracting $M_f I_C$ from $-I_C$ at port 1. The technique uses voltage, $V_{R1} = I_C \cdot R_1$, to sense $I_C$. This voltage appears across the input of the Darlington differential pair formed by $Q_1$ through $Q_4$. The transconductance of the differential pair defines the relation between $V_{R1}$ and $M_f I_C = V_{R1}/4r_e$ or $M_f = R1/4r_e$.

The dynamic impedance of the transistors $Q_1$ through $Q_4$ are incorporated into $M_f$ to allow temperature compensation to the multiplied capacitor. The bias current of $Q_2$ and $Q_4$, $I_o/2$, controls resistance, $r_e$, through the equation $r_e = (nV_T)/(I_o/2)$. This leads to an expression for the effective capacitor which is $C_{eff} = (R1 \cdot I_o C)/(8nV_T)$. When $C_{eff}$ is used with an integrated resistor $R_s$ to form a filter structure, the resulting time constant is $(R1 I_o)/(8nV_T) \times CRs$. $I_o$ is then derived as described hereinabove with reference to FIG. 5 so that it tracks the temperature and tolerance variations of $(R_1 R_s)/(nV_T)$ which results in a predictable and thermally insensitive filter.

Still another variation to the grounded capacitance multiplier is that the grounded terminal of the capacitor is lifted from the ground terminal and used as an input terminal for an incoming signal, as illustrated in FIG. 10. The result is a unidirectional capacitor that looks multiplied only at port 2. This variation provides the multiplied capacitor needed for the filter while providing a high input impedance at port 1. As illustrated in FIG. 11, by providing an output stage of a potential divider made of resistors $R_{11}$ and $R_{12}$ to the unidirectional capacitance multiplier, a simple high pass filter is obtained.

Figure 12:
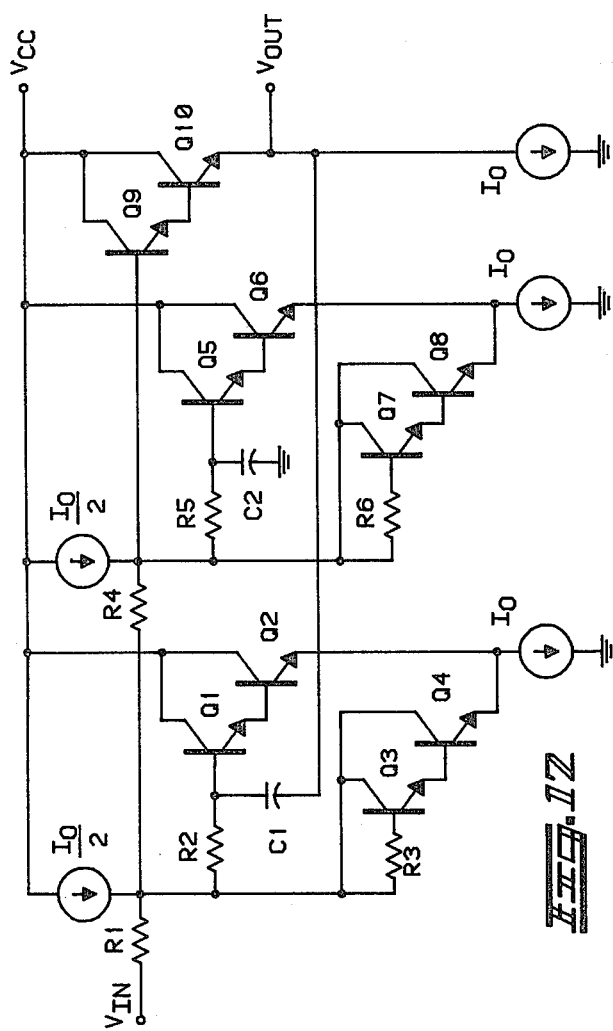
FIG. 12 shows a second-order, low pass filter using a grounded capacitance multiplier and a unidirectional capacitance multiplier.

The unidirectional and bidirectional capacitance multipliers described above with reference to FIGS. 9 and 10 can be easily combined into a network that will form higher order filters with complex roots. For example, as shown in FIG. 12, a unidirectional capacitance multiplier, made of $Q_1$, $Q_2$, $Q_3$, $Q_4$, $C_1$, $R_2$, and $R_3$ is used in a feedback configuration with a grounded capacitance multiplier made of $R_5$, $R_6$, $C_2$, $Q_5$, $Q_6$, $Q_7$ and $Q_8$. The grounded capacitance multiplier receives the input, $V_{IN}$, via resistors $R_1$ and $R_4$ and is coupled to the output, $V_{OUT}$, via transistors $Q_9$ and $Q_{10}$. The output $V_{OUT}$ is fed back via the unidirectional multiplied capacitor $C_1$ to the input of the grounded capacitance multiplier. The filter network as described above is shown in an AC equivalent in FIG. 13. It can be shown that the filter in FIG. 13 is a second-order low pass filter with the capability for complex roots.

FIG. 14 shows a unidirectional capacitance multiplier ($C_1$, $R_1$, $R_2$, $Q_1$, $Q_2$, $Q_3$, $Q_4$) and bidirectional multiplier ($R_3$, $R_4$, $C_2$, $Q_5$, $Q_6$, $Q_7$, $Q_8$) coupled in a way that provides a second-order high pass filter with the capability for complex roots. The equivalent AC functional circuit of FIG. 14 is shown in FIG. 15.

FIG. 16 illustrates how two grounded capacitance multipliers ($C_2$, $Q_{39}$, $Q_{40}$, $Q_{41}$, $Q_{42}$ and $C_4$, $Q_{54}$, $Q_{55}$, $Q_{56}$, $Q_{57}$ and associated elements) and two unidirectional capacitance multipliers ($C_3$, and $Q_{46}$, $Q_{47}$, $Q_{48}$, $Q_{49}$ and $C_5$, $Q_{61}$, $Q_{62}$, $Q_{63}$, $Q_{64}$ and associated elements) are coupled in series to form an audio bandpass filter. The values of elements of the filter are selected so that the filter provides a bandpass filter in the audio range that falls within the specifications prescribed for the standard Electronic Industry Association (EIA) audio receiver filter, as illustrated in the amplitude vs. frequency response characteristic plot shown in FIG. 17.

Referring to FIG. 16, it is pointed out that to provide further predictability and thermal insensitivity to the filter circuit, a diode is interposed between the DC bias controlled current source and the common junctions at the input side of respective Darlington pairs, as shown by the diodes $D_{10}$, $D_{11}$, $D_{12}$ and $D_{14}$, and transistors $Q_{36}$, $Q_{45}$, $Q_{53}$ and $Q_{59}$ between the DC power supply, $V_{cc}$, and the collector electrodes of the first Darlington transistor pairs of the respective Darlington pairs.

The diode-transistor pairs $D_{10}$ and $Q_{36}$, $D_{11}$ and $Q_{45}$, etc. provide a predetermined potential drop between the common junctions 21, 22, 25 and 26 and the collector electrodes of the associated Darlington pairs and thereby provide increased predictability and thermal insensitivity in the operation of each capacitance multiplier stage.

Any further detailed description of the value and/or realization of the various circuit elements and the various filter circuits with reference to various embodiments of the filters illustrated in the schematic and functional drawings are believed unnecessary in that armed with description given above and the drawings, one of ordinary skill can easily understand and practice the present inventive integrated filter circuits.

In summary then, we have shown how various capacitance multiplying techniques illustrated in FIGS. 2, 9 and 10 provide a flexible technique whereby a variety of integrated filtering circuits can be provided. Thus, for example, how the grounded capacitance multiplier shown in FIG. 2 can be used to form low pass, high pass and bandpass filters as illustrated in FIGS. 6, 7 and 8; how the unidirectional capacitance multiplier illustrated in FIG. 10 can be utilized to provide a high pass filter as illustrated in FIG. 11; how the unidirectional capacitance multiplier illustrated in FIG. 10 can be combined with a grounded capacitance multiplier illustrated in FIG. 2 to provide a second-order low pass filter as illustrated in FIGS. 12 and 13; how a unidirectional and a bidirectional multiplier can be combined to provide a second-order high pass filter as illustrated in FIGS. 14 and 15; and how a pair of grounded capacitance multipliers and a pair of unidirectional multipliers can be combined in series to provide a bandpass filter which may be especially adapted to provide an audio bandpass filter as illustrated in FIGS. 16 and 17.

It is to be understood that the various filters disclosed and described are intended to be illustrative examples. Various other filters can be easily formed using the grounded multipliers and bidirectional or unidirectional multipliers illustrated herein in various combinations to provide higher order cascaded filters by those skilled in the art.

In each of the filters, unique inventive DC bias controlled current circuit is operatively combined with the multipliers so that the cutoff frequency is not subject to the changes in the value of the resistances in the circuit due to temperature changes as they are subjected to in actual operation and absolute value changes as the result of the manufacturing process. This is made possible as explained hereinbefore by making the cutoff frequency, $f_c$, of the analog integrated filter circuit depend upon the ratios of resistive elements of the integrated circuit rather than their absolute values which change as the result of the manufacturing process and as a result of the change in temperature of the resistors. Also, as described hereinabove, the analog integrated filter circuit of the present invention allows for the programmability of the filter corner frequencies by changing an external resistance value.

Further changes and modifications may be made to the various illustrative, inventive embodiments of the present invention by one skilled in the art without departing from the spirit and scope of the principles of the present invention described in this application.

We claim:

1. An analog integrated filter comprising: capacitance multiplier means, including a capacitor (C), having a first and a second terminal, for providing an effective capacitance $M_f$ times that of the capacitor, and including a feedback impedance dependent upon an applied current; resistance means, coupled to the capacitance multiplier means, for providing resistance operative in conjunction with the effective capacitance to provide filtering; and, DC bias-controlled current supplying circuit, coupled to the capacitance multiplier means, for providing a DC bias-controlled current having a temperature dependence which substantially cancels the cumulative temperature dependence of the feedback impedance and the resistance means, so that the filter has a constant operating frequency response characteristic as the filter operates over a range of temperatures.

2. The filter according to claim 1, wherein said capacitance multiplier means having a first and second pair of Darlington transistors, wherein the output emitter electrode of the first pair is coupled to that of the second pair, the base electrode of the first pair is connected to said resistance means ($R_1$) and to the first terminal of the capacitor (C), the base electrode of the second pair is coupled to a second resistor ($R_2$) and to the collector electrodes of the second pair of Darlington transistors, such that the first and the second resistors are coupled to a common junction.

3. The filter according to claim 2, wherein said filter includes an input resistor ($R_s$) for applying the input signal to the Darlington pair of said capacitance multiplier through the common junction, wherein said DC bias-controlled current supplying circuit includes:

a circuit including a first resistor ($R_{B1}$) for supplying a reference current, $I_H$, wherein the magnitude of the reference current is proportional to the temperature of the integrated filter and inversely proportional to the resistance of the first resistor, ($R_{B1}$), a circuit which is coupled to the reference current supplying circuit for supplying a first-controlled bias current, $I_o$ the magnitude of which is proportional to the reference current, a circuit coupled to the first-controlled bias current circuit for supplying a second controlled bias current, the magnitude of which is proportional to the first-controlled bias current, a second resistor ($R_{EX}$) disposed externally to the integrated filter and coupleable to the reference current supplying circuit for draining the reference current therethrough from the reference current supplying circuit, thereby providing a voltage drop ($V_{EX}$) thereacross by the reference current, thereby the amplitude of the first-controlled bias current is related such that $$I_o = \frac{I_H R_{EX}}{R_{B2}}$$

$$= \frac{n V_T \cdot \log_e A \cdot R_{EX}}{R_{B1} \cdot R_{B2}}$$

and
$V_T = KT/q$ where n is a characteristic number of the emitter-to-base function of the integrated circuit
K is Boltzman's constant
T is temperature in Kelvin
q is charge in coulombs
A is a semiconductor junction area scaling ratio whereby said filter provides a 3 db cutoff frequency, $f_c$, $$f_c = \frac{8n \cdot V_T}{2\pi \cdot R_s \cdot C \cdot R_1 \cdot I_o}$$

$$= \frac{8 R_{B1} R_{B2}}{2\pi \cdot \log_e A \cdot C \cdot R_s \cdot R1 \cdot R_{EX}}$$

wherein $f_c$ is made to be directly related to the ratio $$\frac{R_{B1} \cdot R_{B2}}{R_s \cdot R_1}$$

and thereby $f_c$ is made immune to the thermal drift of the individual resistors in the integrated filter, and insensitive to absolute value changes of the individual resistors in the integrated filter.

4. The filter according to claim 3, wherein the cutoff frequency, $f_c$ is changed to a different value by changing the resistance value of the second resistor $R_{EX}$, whereby the filter is rendered programmable to provide different $f_c$.

5. The filter according to claims 3 or 4, including a first grounded capacitance multiplier by grounding the second terminal of the capacitor of the multiplier, said first bias control current applied to the emitter electrodes of the two Darlington pairs as current sinks, and a second bias control current applied to the common junction, said second bias control current having an amplitude which is a predetermined portion of said first bias control, whereby the filter is rendered to operate as a low pass filter.

6. The filter according to claim 5, including the first grounded capacitance multiplier is coupled to receive an input signal and a subtractive circuit coupled to receive the input signal and the output of the first grounded multiplier and provide an output whereby the filter is rendered to operate as a high pass filter.

7. The filter according to claim 3, wherein the second terminal of said capacitance multiplier is coupled to receive an input signal and providing output at the common junction thereby forming a unidirectional capacitance multiplier.

8. The filter according to claim 7 having means for applying an input signal to the unidirectional capacitance multiplier and output circuit coupled to the common junction for providing an output of the filter whereby the filter is rendered to operate as a high pass filter.

9. The filter according to claim 3 connecting the second terminal of the capacitor to the collector electrode of the first Darlington pair and supplying the second bias control current to the junction of the capacitor and the collector electrode of the first Darlington pair, thereby forming a bidirectional multiplier.

10. The filter according to claim 7, including a first grounded capacitance multiplier by grounding the second terminal of the capacitor of the multiplier, said first bias control current applied to the emitter electrodes of the two Darlington pairs as current sinks, and a second bias control current applied to the common junction, said second bias control current having an amplitude which is a predetermined portion of said first bias control, whereby the filter is rendered to operate as a low pass filter, and a second capacitance multiplier arranged in the form of said unidirectional capacitance multiplier shunted across the first-grounded capacitance multiplier in a feedback mode, to provide a second-order low pass filter.

* * * * *